(12) United States Patent
Hong

(10) Patent No.: US 11,475,697 B2
(45) Date of Patent: Oct. 18, 2022

(54) DISPLAY DEVICE

(71) Applicant: Xiamen Tianma Micro-Electronics Co., Ltd., Xiamen (CN)

(72) Inventor: Jinlong Hong, Xiamen (CN)

(73) Assignee: Xiamen Tianma Micro-Electronics Co., Ltd., Xiamen (CN)

(*) Notice: Subject to any disclaimer, the term of this patent is extended or adjusted under 35 U.S.C. 154(b) by 286 days.

(21) Appl. No.: 16/891,086

(22) Filed: Jun. 3, 2020

(65) Prior Publication Data

US 2020/0293742 A1 Sep. 17, 2020

(30) Foreign Application Priority Data

Mar. 27, 2020 (CN) .......................... 202010229845.3

(51) Int. Cl.
*H05K 1/18* (2006.01)
*G06V 40/13* (2022.01)

(52) U.S. Cl.
CPC ......... *G06V 40/1318* (2022.01); *H05K 1/181* (2013.01); *H05K 1/189* (2013.01); *H05K 2201/056* (2013.01); *H05K 2201/10106* (2013.01); *H05K 2201/10128* (2013.01)

(58) Field of Classification Search
CPC ................................................ G06V 40/1318
USPC ........................................................ 361/749
See application file for complete search history.

(56) References Cited

U.S. PATENT DOCUMENTS

| | | | |
|---|---|---|---|
| 2017/0273177 A1* | 9/2017 | Nishimoto | H05K 1/118 |
| 2019/0065815 A1* | 2/2019 | Park | H01L 27/288 |
| 2020/0014893 A1* | 1/2020 | Li | H04N 9/3144 |
| 2020/0174526 A1* | 6/2020 | Jeong | G06F 1/1626 |
| 2020/0343477 A1* | 10/2020 | Zeng | H01L 27/3262 |
| 2020/0350512 A1* | 11/2020 | Guo | H01L 51/5253 |
| 2021/0216741 A1* | 7/2021 | Zhang | G02B 6/009 |
| 2022/0084318 A1* | 3/2022 | Wu | G06V 40/1318 |

FOREIGN PATENT DOCUMENTS

| | | |
|---|---|---|
| CN | 203706615 U | 7/2014 |
| CN | 108388826 A | 8/2018 |

* cited by examiner

*Primary Examiner* — Stanley Tso
(74) *Attorney, Agent, or Firm* — Kilpatrick Townsend & Stockton, LLP

(57) ABSTRACT

Provided is a display device, including: an array substrate having a display area and a non-display area at least partially surrounding the display area, and the non-display area includes a step region, and a part of the display area is reused as a fingerprint recognition region; a flexible circuit board bonded to the step region and bent to a side of the array substrate facing away from a light-exiting direction of the display device, and the flexible circuit board includes a bent portion facing towards a side surface of the array substrate, and the bent portion includes a bent sub-portion, which is tilted towards the display area along the light-exiting direction of the display device; and at least one light source arranged on the bent sub-portion of the flexible circuit board, and light emitted from the at least one light source is transmitted towards the fingerprint recognition region.

19 Claims, 10 Drawing Sheets

DISPLAY DEVICE

CROSS-REFERENCE TO RELATED APPLICATIONS

The present application claims priority to Chinese Patent Application No. 202010229845.3, filed on Mar. 27, 2020, the content of which is incorporated herein by reference in its entirety.

FIELD

The present disclosure relates to the field of display technologies, and in particular, to a display device.

BACKGROUND

Currently, a fingerprint recognition function is usually achieved in a display device by an under-screen fingerprint recognition technology. In the related art, two setting manners are provided for a light source configured to provide detection light for fingerprint recognition, including a directly downright setting manner and a side setting manner. When the light source adopts the side setting manner, the light source may be arranged at a lower side of a glass cover or on a case of the display device. In this case, however, it will increase a length of the glass cover, which is disadvantageous to a narrow bezel design for the display device.

SUMMARY

In view of this, an embodiment of the present disclosure provides a display device, aiming to reduce a length of a glass cover, facilitating a narrow bezel design for the display device.

An embodiment of the present disclosure provides a display device, including: an array substrate having a display area and a non-display area at least partially surrounding the display area, and the non-display area includes a step region, and a part of the display area is reused as a fingerprint recognition region; a flexible circuit board, and the flexible circuit board is bonded to the step region and is bent to a side of the array substrate facing away from a light-exiting direction of the display device; the flexible circuit board includes a bent portion facing towards a side surface of the array substrate; and the bent portion includes a bent sub-portion, which is tilted towards the display area along the light-exiting direction of the display device; and at least one light source arranged on the bent sub-portion of the flexible circuit board, and light emitted from the at least one light source is transmitted towards the fingerprint recognition region.

BRIEF DESCRIPTION OF DRAWINGS

Embodiments of the present disclosure are described in the following with reference to the accompanying drawings. It should be understood that the described embodiments are merely exemplary embodiments of the present disclosure, which shall not be interpreted as providing limitations to the present disclosure.

DESCRIPTION OF EMBODIMENTS

Embodiments of the present disclosure will be described in detail as follows with reference to the accompanying drawings.

It should be noted that, the described embodiments are merely exemplary embodiments of the present disclosure, which shall not be interpreted as providing limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, In one embodiment, A and/or B may indicate that three cases, i.e., A existing individually, A and B existing simultaneously, B existing individually. In addition, the character "/" herein generally indicates that the related objects before and after the character form an "or" relationship.

It should be understood that although a region may be described using the terms of "first", "second", etc., in the embodiments of the present disclosure, the region will not be limited to these terms. These terms are merely used to distinguish regions from one another. In one embodiment, without departing from the scope of the embodiments of the present disclosure, a first region may also be referred to as a second region, and similarly, a second region may also be referred to as a first region.

Figure 1:
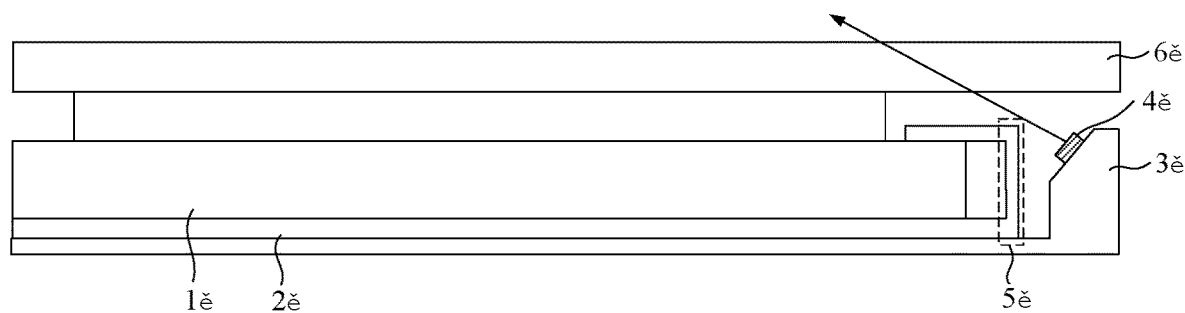
FIG. 1 is a schematic diagram of a structure of a display device in the related art.

Embodiments of the present disclosure provide a structure of the display device in the related art will be first described first in the following. As shown in FIG. 1, which is a schematic diagram of a structure of a display device in the related art, the display device includes: an array substrate 1', a flexible circuit board 2', a case 3', and a light source 4'. The flexible circuit board 2' is bonded to the array substrate 1' and bent to a back surface of the array substrate 1'. The flexible circuit board 2' includes a bent portion 5', which is a part of the flexible circuit board 2' disposed oppositely to a side surface of the array substrate 1'. The light source 4' is arranged on the case 3', and the light source 4' is located at a side of the bent portion 5' facing away from the array substrate 1'. However, such arrangement might lead to a large length for a glass cover 6' which covers the array substrate 1', which is disadvantageous to a narrow bezel design for the display device.

Figure 2:
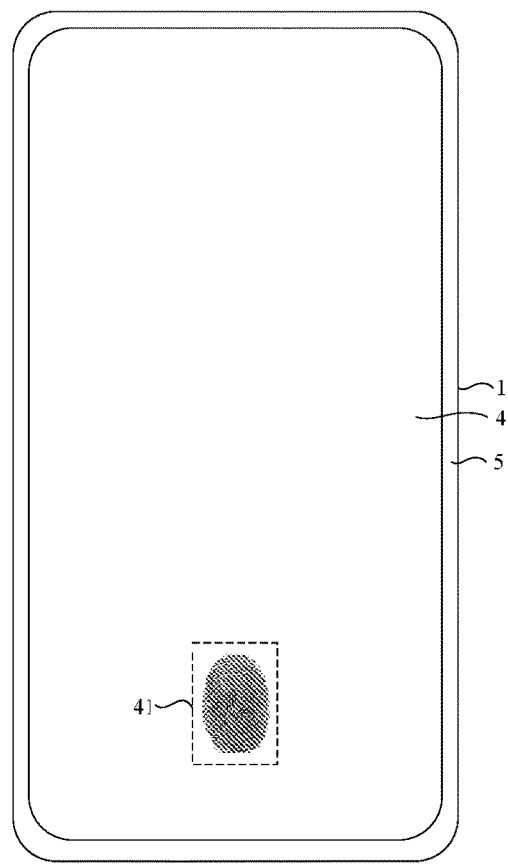
FIG. 2 is a schematic diagram of a structure of a display device according to an embodiment of the present disclosure.
Figure 3:
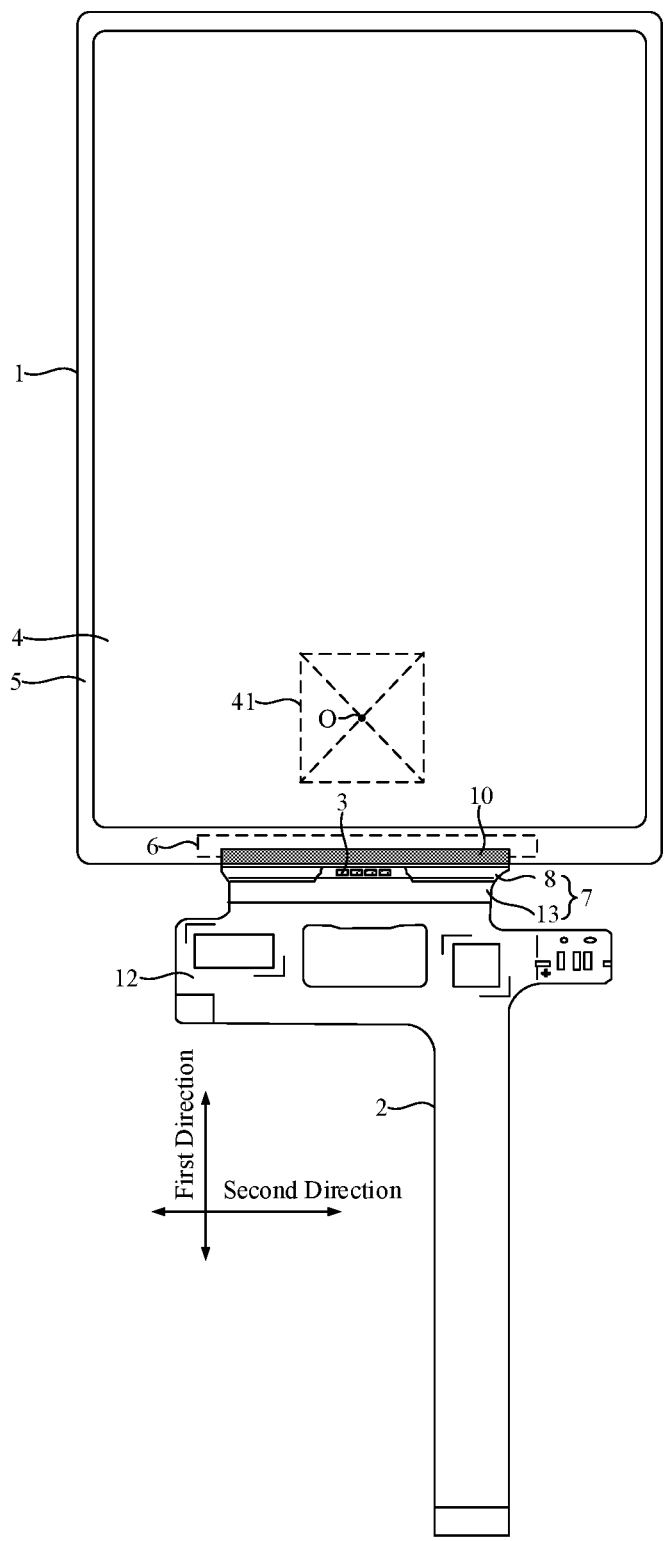
FIG. 3 is a schematic diagram of a structure of a display device according to an embodiment of the present disclosure in a case in which a flexible circuit board is not bent.
Figure 4:
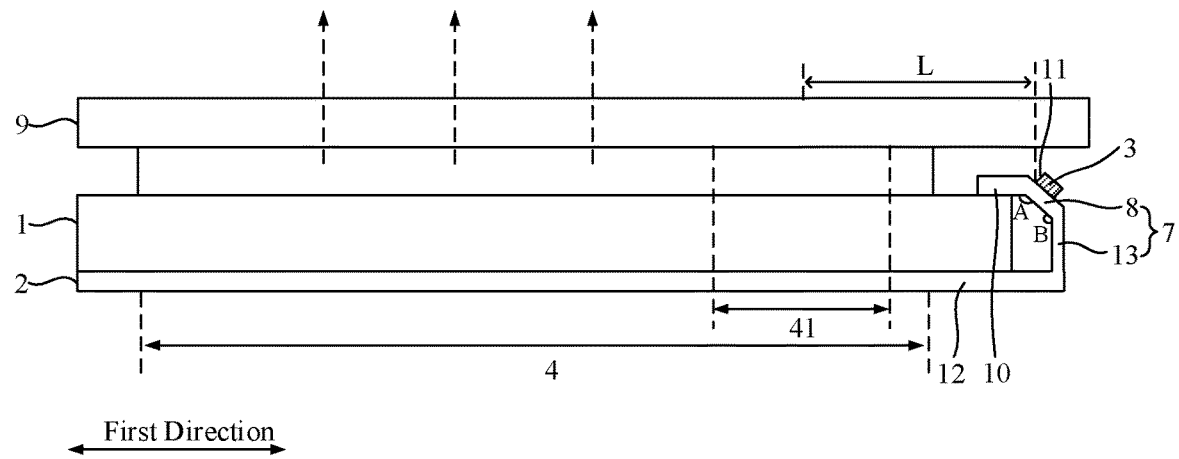
FIG. 4 is a schematic diagram of a structure of a display device according to an embodiment of the present disclosure in a case in which a flexible circuit board is bent.

In view of this, embodiments of the present disclosure provide a display device, as shown in FIG. 2 to FIG. 4. FIG. 2 is a schematic diagram of a structure of a display device according to an embodiment of the present disclosure, FIG. 3 is a schematic diagram of a structure of a display device according to an embodiment of the present disclosure in a case in which a flexible circuit board is not bent, and FIG. 4 is a schematic diagram of a structure of a display device according to an embodiment of the present disclosure in a case in which a flexible circuit board is bent. The display device includes an array substrate 1, a flexible circuit board 2 and at least one light source 3. The array substrate 1 has a display area 4 and a non-display area 5 at least partially surrounding the display area 4. The non-display area 5 includes a step region 6, and a part of the display area 4 is reused as a fingerprint recognition region 41. The flexible circuit board 2 is bonded to the step region 6 and is bent to a side of the array substrate 1 facing away from a light-exiting direction of the display device. The flexible circuit board 2 includes a bent portion 7, which is a part of the flexible circuit board 2 opposite to a side surface of the array substrate 1. The bent portion 7 includes a bent sub-portion 8, which is tilted towards the display area 4 along the light-exiting direction of the display device (as shown by a dashed arrow direction in FIG. 4). The light source 3 is arranged at the sub-bent portion 8 of the flexible circuit board 2, and light emitted from the light source 3 is transmitted towards the fingerprint recognition region 41.

First, it should be noted that, a part of the display area 4 being reused as the fingerprint recognition region 41 means that an area in which the fingerprint recognition region 41 is located can be used for both image display and fingerprint recognition. When the display device is in a fingerprint recognition mode, the light source 3 is driven to emit light. Since the light source 3 is arranged at the bent sub-portion 8, which is tilted towards the display area 4 along the light-exiting direction of the display device, light emitted from the light source 3 will be obliquely transmitted towards the fingerprint recognition region 41. The light emitted from the light source 3 is reflected by a finger and then transmitted to sensors in the fingerprint recognition region 41. The sensors at different positions will perform ridge-valley recognition on the fingerprint based on an intensity of the reflected light that is received, achieving fingerprint recognition. When the display device is in a display mode, the light source 3 does not emit light and thus will not affect normal display of the fingerprint recognition region 41.

In the display device provided by the embodiments of the present disclosure, the tilted bent sub-portion 8 is included in the bent portion 7 of the flexible circuit board 2, and the light source 3 is provided on the bent sub-portion 8, so that the light emitted from the light source 3 can be obliquely transmitted towards the fingerprint recognition region 41 and then reflected by the finger and then transmitted to the sensors. Based on such arrangement, under a premise of achieving the fingerprint recognition function, a space occupied by the light source 3 in the first direction (a direction along which the display area 4 and the step region 6 are arranged) coincides with a space occupied by a part of the bent portion 7 in the first direction. That is, the light source 3 does not need to occupy an additional space, so there is no need to increase a length of the glass cover 9 covering the array substrate 1 in the first direction, which can facilitate a narrow bezel design for the display device. Moreover, decreasing the length of the glass cover 9 in the first direction can also reduce a manufacturing cost of the display device, which facilitates achieving low-cost manufacturing of the display device.

In addition, with further reference to FIG. 1, if the light source 4' is arranged in a manner in the related art, partial light emitted from the light source 4' will be blocked by the flexible circuit board 2' and thus cannot be further transmitted to the fingerprint recognition region, causing light loss. With the arrangement provided by this embodiment of the present disclosure, the light source 3 is arranged directly on the flexible circuit board 2, so the light emitted from the light source 3 will not be blocked by the flexible circuit board 2, reducing light loss. In this case, all light emitted from the light source 3 can be transmitted to the fingerprint recognition region 41, increasing the intensity of light transmitted to the finger. When the light is reflected by the finger and then transmitted to the sensors in the fingerprint recognition region 41, an intensity difference between the reflected light corresponding to a fingerprint valley and the reflected light corresponding to a fingerprint ridge will be increased, so that the fingerprint valley and the fingerprint ridge can be more accurately recognized, increasing a detection accuracy of fingerprint recognition.

In addition, it should be noted that the display device shown in FIG. 2 is merely a schematic illustration, and the display device may be any electronic device with a display function, such as a cellphone, a tablet computer, a notebook computer, an electronic paper book, or a television.

In an embodiment, with further reference to FIG. 3 and FIG. 4, the flexible circuit board 2 further includes a bonding portion 10. The flexible circuit board 2 is bonded to the step region 6 through the bonding portion 10, and the bonding portion 10 is connected to the bent sub-portion 8. The bonding portion 10 and the step region 6 each are provided with a plurality of pins, and the flexible circuit board 2 being bonded to the step region 6 through the bonding portion 10 means that the pins of the bonding portion 10 are connected to the corresponding pins of the step region 6 to form a signal transmission path. An angle A is formed between the bent sub-portion 8 and the bonding portion 10, where $145°≤A≤175$. A distance between a center point O of the fingerprint recognition region 41 and a light-exiting surface 11 of the light source 3 is L, where $0<L≤20$ mm. With reference to FIG. 3, the center point O of the fingerprint recognition region 41 is an intersection of diagonal lines of the fingerprint recognition region 41.

It is understood that in order to allow the light emitted from the light source 3 to be transmitted to the fingerprint recognition region 41 and reflected by the finger, a transmission direction of the light emitted from the light source 3 needs to form an angle with a plane of the bonding portion 10. The light emitted from the light source 3 shall be transmitted neither along a direction parallel with the light-exiting direction of the display device (hereinafter referred to as a perpendicular direction), nor along a direction perpendicular to the light-exiting direction of the display device (hereinafter referred to as a parallel direction).

Figure 5:
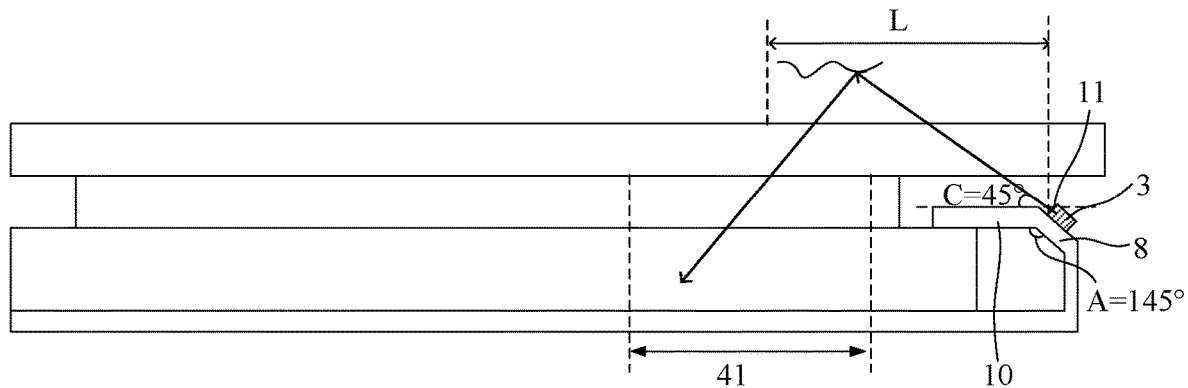
FIG. 5 is a schematic diagram illustrating light transmission corresponding to A=145° according to an embodiment of the present disclosure.
Figure 6:
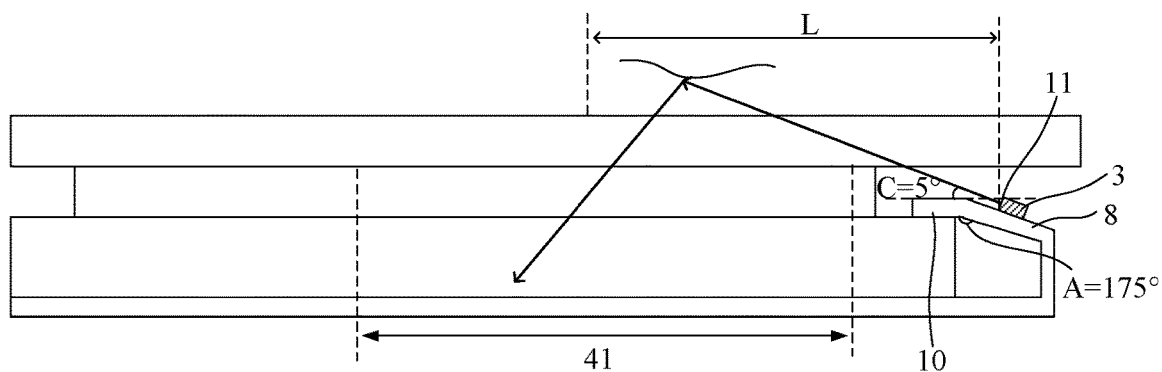
FIG. 6 is a schematic diagram illustrating light transmission corresponding to of A=175° according to an embodiment of the present disclosure.

In addition, it should be understood that when the light source 3 is arranged on the bent sub-portion 8, an angle formed between the bent sub-portion 8 and the bonding portion 10 is A, and an angle formed between the transmission direction of the light emitted from the light source 3 and the plane of the bonding portion 10 is C, where $A+C=180°$. Based on this, as shown in FIG. 5, which is a schematic diagram illustrating light transmission corresponding to $A=145°$ according to an embodiment of the present disclosure, the minimum value of the angle A formed between the bent sub-portion 8 and the bonding portion 10 is set to 145°, meaning that the maximum value of the angle C formed between the transmission direction of the light emitted from the light source 3 and the plane of the bonding portion 10 is 35°. This can avoid the extremely large angle formed between the transmission direction of the light emitted from the light source 3 and the plane of the bonding portion 10, prevent the light emitted from the light source 3 from being transmitted along a direction close to the perpendicular direction. As shown in FIG. 6, which is a schematic diagram illustrating light transmission corresponding to $A=175°$ according to an embodiment of the present disclosure, the maximum value of the angle A formed between the bent sub-portion 8 and the bonding portion 10 is set to 175°, meaning that the minimum value of the angle C formed between the transmission direction of the light emitted from the light source 3 and the plane of the bonding portion 10 is 5°. This can avoid the extremely small angle formed between the transmission direction of the light emitted from the light source 3 and the plane of the bonding portion 10, preventing the light emitted from the light source 3 from being transmitted along a direction close to a horizontal direction.

Therefore, the angle A formed between the bent sub-portion 8 and the bonding portion 10 is within a range of 145° to 175°, so that the light emitted from the light source 3 can be transmitted obliquely towards the fingerprint recognition region 41 to a greater extent. In this way, the intensity of light transmitted to the finger can be increased. Therefore, when the light is reflected by the finger to the sensors in the fingerprint recognition region 41, an intensity difference between the reflected light corresponding to the fingerprint valley and the reflected light corresponding to the fingerprint ridge will be increased, so that the fingerprint valley and the fingerprint ridge can be more accurately recognized, optimizing the fingerprint recognition function. Further, by adjusting a position of the fingerprint recognition region 41, the distance L between the center point O of the fingerprint recognition region 41 and the light-exiting surface 11 of the light source 3 is set to be within a range from 0 to 20 mm. In this case, when the finger is placed in the fingerprint recognition region 41, all light emitted from the light source 3 can be transmitted to the finger and then reflected by the finger to the sensor and then received by the sensor, effectively improving reliability of fingerprint recognition.

In addition, it should be noted that the distance L between the center point O of the fingerprint recognition region 41 and the light-exiting surface 11 of the light source 3 is positively related to the angle A formed between the bent sub-portion 8 and the bonding portion 10. That is, the larger angle A formed between the bent sub-portion 8 and the bonding portions 10 leads to the larger distance L between the center point O of the fingerprint recognition region 41 and the light-exiting surface 11 of the light source 3. In one embodiment, L corresponding to $A=175°$ is larger than L corresponding to $A=145°$.

In an embodiment, with further reference to FIG. 3 and FIG. 4, the flexible circuit board 2 further includes a function portion 12, which is a part of the flexible circuit board 2 that is bent to a side of the array substrate 1 facing away from the light-exiting direction of the display device. The function portion 12 is usually provided with devices, pins or connection traces, etc. The bent portion 7 further includes a transition sub-portion 13 located between the bent sub-portion 8 and the function portion 12, and an angle B is formed between the transition sub-portion 13 and the bent sub-portion 8, where $B<180°$.

When the angle formed between the bent sub-portion 8 and the bonding portion 10 is constant, if the bent portion 7 includes only the bent sub-portion 8 and an entirety of the bent portion 7 is obliquely arranged, the bent portion 7 will occupy a large length in the first direction. Correspondingly, the glass cover 9 will also have a large length. In this embodiment of the present disclosure, by setting a transition sub-portion 13 between the bent sub-portion 8 and the function portion 12 and making the angle B formed between the transition sub-portion 13 and the bent sub-portion 8 be smaller than 180°, the length of the bent portion 7 in the first direction can be reduced by means of the transition sub-portion 13. Correspondingly, the length of the glass cover 9 in the first direction can be reduced, that is, a width of a lower bezel of the display device is reduced.

Further, when setting the transition sub-portion 13, the angle formed between the transition sub-portion 13 and the function portion 12 can be 90°, reducing the space occupied by the bent portion 7 in the first direction to a greater extent.

Figure 7:
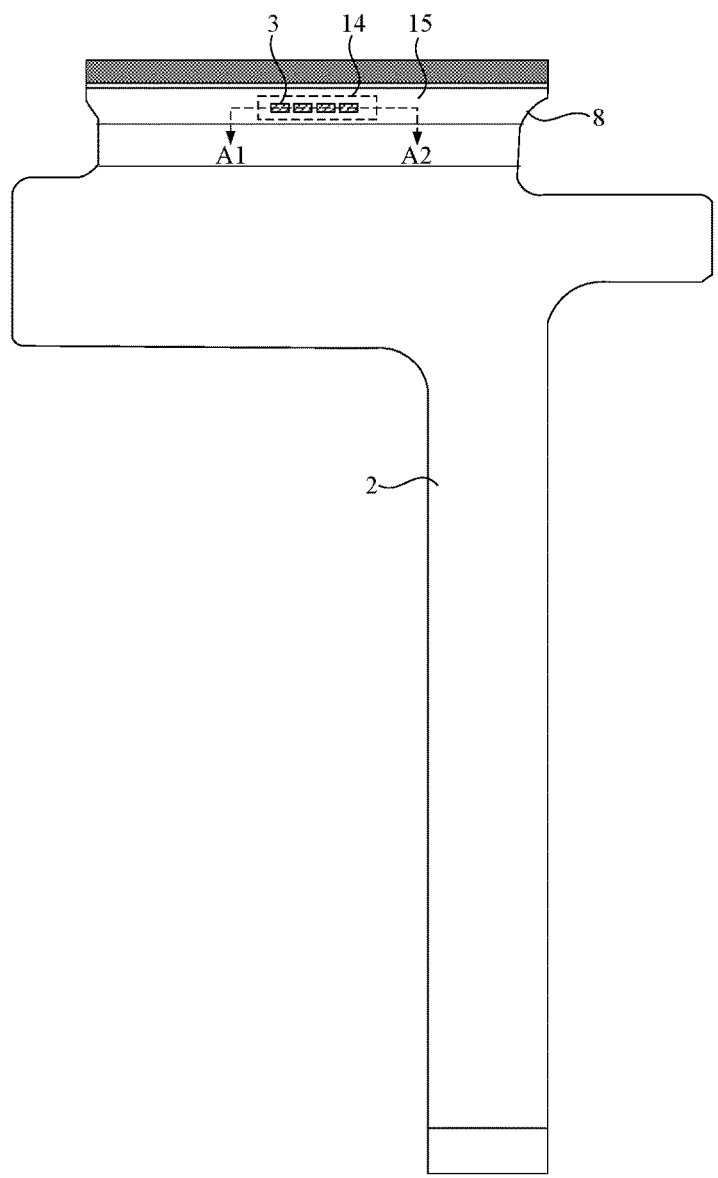
FIG. 7 is a schematic diagram of a structure of a flexible circuit board which is not bent according to an embodiment of the present disclosure.
Figure 8:
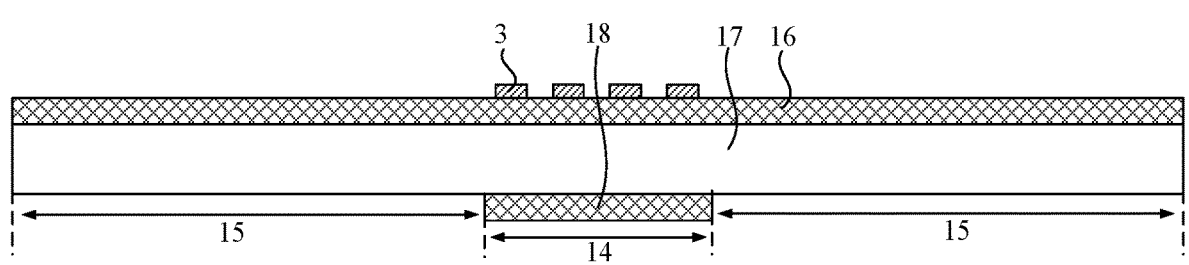
FIG. 8 is a cross-sectional view along line A1-A2 shown in FIG. 7.

FIG. 7 is a schematic diagram of a structure of a flexible circuit board which is not bent according to an embodiment of the present disclosure, and FIG. 8 is a cross-sectional view along line A1-A2 shown in FIG. 7. In an embodiment, as shown in FIG. 7 and FIG. 8, the flexible circuit board 2 has a first region 14 and a second region 15, and the light source 3 is disposed in the first region 14. The flexible circuit board 2 has a larger thickness in the first region 14 than in the second region 15. By increasing the thickness of the flexible circuit board 2 in the first region 14, toughness of the first region 14 can be increased. In this case, when the flexible circuit board 2 is bent, a risk of fracture in the first region 14 can be reduced. In this way, a risk of the light source 3 falling off from the bent sub-portion 8 can be reduced, and a risk that the light source 3 moves relative to the bent sub-portion 8 can be reduced. Thus, when the light source 3 is driven to emit light, the accuracy of the transmission direction of the light emitted from the light source 3 can be increased, further improving reliability of fingerprint recognition.

In an embodiment, with further reference to FIG. 8, the flexible circuit board 2 includes a first metal foil 16, a base 17 and a second metal foil 18. An orthographic projection of the first metal foil 16 onto the base 17 overlaps the first region 14 and the second region 15, and an orthographic projection of the second metal foil 18 onto the substrate 17 overlaps the first region 14. The first metal foil 16 and the second metal foil 18 are patterned to form structures on the flexible circuit board 2 such as devices and traces. The first metal foil 16 and the second metal foil 18 may be copper foils, which may be respectively arranged on two sides of the base 17. By providing two layers of foils, which are the first metal foil 16 and the second metal foil 18, in the first region 14 of the flexible circuit board 2, the thickness of the flexible circuit board 2 in the first region 14 can be increased by the second metal foil 18, increasing the toughness of the flexible circuit board 2 in the first region 14. In this way, a risk of fracture in the first region 14 can be reduced, improving stability of the light source 3 on the bent sub-portion 8.

Figure 9:
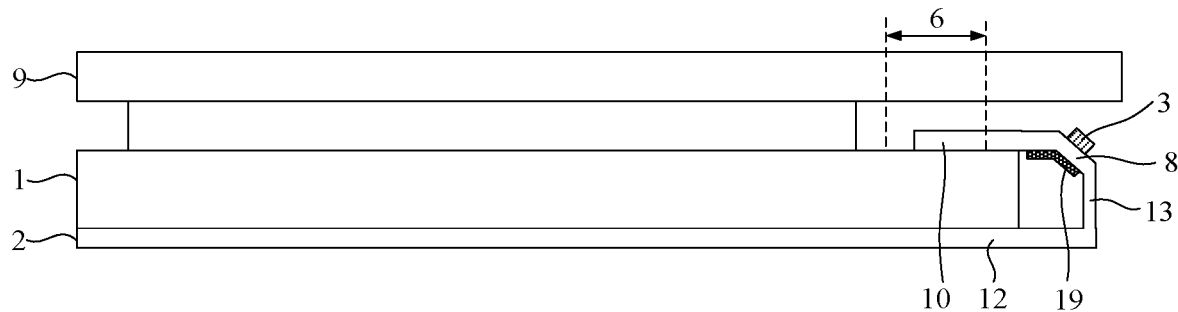
FIG. 9 is a schematic diagram of a structure of a stabilization layer according to an embodiment of the present disclosure.

FIG. 9 is a schematic diagram of a structure of a stabilization layer according to an embodiment of the present disclosure. In an embodiment, as shown in FIG. 9, the flexible circuit board 2 further includes a bonding portion 10, and the flexible circuit board 2 is bonded to the step region 6 through the bonding portion 10. The bonding portion 10 is connected to the bent sub-portion 8. The bonding portion 10 and the step region 6 each are provided with a plurality of pins, and the flexible circuit board 2 being bonded to the step region 6 through the bonding portion 10 means that the pins of the bonding portion 10 are connected to the corresponding pins of the step region 6 to form a signal transmission path. The display device further includes a stabilization layer 19, which is located at a side of the bonding portion 10 facing away from the light-exiting direction of the display device and a side of the bent sub-portion 8 facing away from the light-exiting direction of the display device. The stabilization layer 19 overlaps at least a junction between the bonding portion 10 and the bent sub-portion 8.

When the bent sub-portion 8 is bent relative to the bonding portion 10, the junction between the bonding portion 10 and the bent sub-portion 8 is likely to break, causing the bent sub-portion 8 to separate from the bonding portion 10. In this embodiment of the present disclosure, the stabilization layer 19 is provided at the side of the bonding portion 10 facing away from the light-exiting direction of the display device and the side of the bent sub-portion 8 facing away from the light-exiting direction of the display device, and the stabilization layer 19 overlaps the junction between the bonding portion 10 and the bent sub-portion 8, so that stability of the connection between the bonding portion 10 and the bent sub-portion 8 can be improved by the stabilization layer 19. Thus, a risk of fracture of the junction can be reduced, preventing the bent sub-portion 8 from breaking away from the bonding portion 10. In this way, the accuracy of the transmission direction of the light emitted from the light source 3 can be increased, further improving reliability of fingerprint recognition.

Further, with further reference to FIG. 9, in order to further avoid breakage at the position of the light source 3 on the bent sub-portion 8, prevent the light source 3 from falling off from the bent sub-portion 8 or from moving relative to the bent sub-portion 8, an orthographic projection of the stabilization layer 19 onto the bent sub-portion 8 overlaps an orthographic projection of the light source 3 onto the bent sub-portion 8.

In an embodiment, the stabilization layer 19 is an adhesive layer. Based on adhesiveness of the adhesive layer, when the bent sub-portion 8 is bent relative to the bonding portion 10, even if breakage occurs between the bonding portion 10 and the bent sub-portion 8 due to an external bending force, the bonding portion 10 and the bent sub-portion 8 can still be adhered to the adhesive layer. In this way, the bent sub-portion 8 can be prevented from breaking away from the bonding portion 10.

In an embodiment, the stabilization layer 19 is a reinforcing plate, such as a glass fiber reinforcing plate (FR4) or a stainless steel reinforcing plate (SUS). By setting the stabilization layer 19 as a reinforcing plate, the angle formed between the bonding portion 10 and the bent sub-portion 8 can be further fixed by the reinforcing plate. Thus, the angle formed between the bonding portion 10 and the bent sub-portion 8 will not change and be maintained as constant. In this way, the accuracy of the transmission direction of the light emitted from the light source 3 can be increased.

Figure 10:
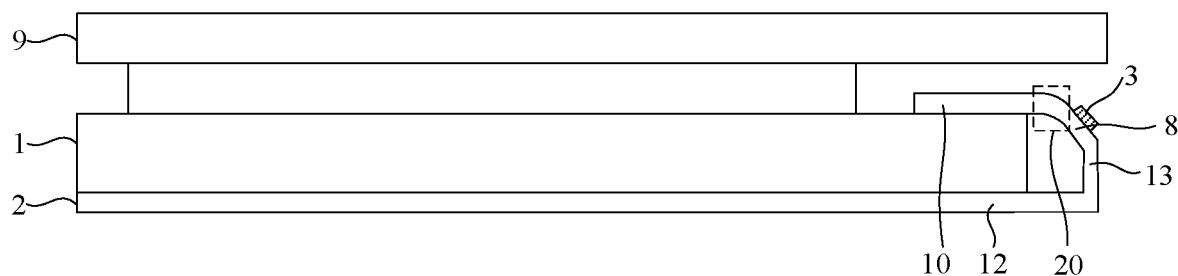
FIG. 10 is a schematic diagram of a structure of another display device according to an embodiment of the present disclosure in a case in which a flexible circuit board is bent.

FIG. 10 is a schematic diagram of another structure of a display device according to an embodiment of the present disclosure in a case in which a flexible circuit board is bent. In the embodiment, as shown in FIG. 10, the flexible circuit board 2 further includes a bonding portion 10, and the flexible circuit board 2 is bonded to the step region 6 through the bonding portion 10. The bonding portion 10 is connected to the bent sub-portion 8. The bonding portion 10 and the step region 6 each are provided with a plurality of pins, and the flexible circuit board 2 being bonded to the step region 6 through the bonding portion 10 means that the pins of the bonding portion 10 are connected to the corresponding pins of the step region 6 to form a signal transmission path. The bonding portion 10 is connected to the bent sub-portion 8 by an arc-shaped connection portion 20, so that the transition between the bonding portion 10 and the bent sub-portion 8 is smoother, reducing the risk of breakage.

Figure 11:
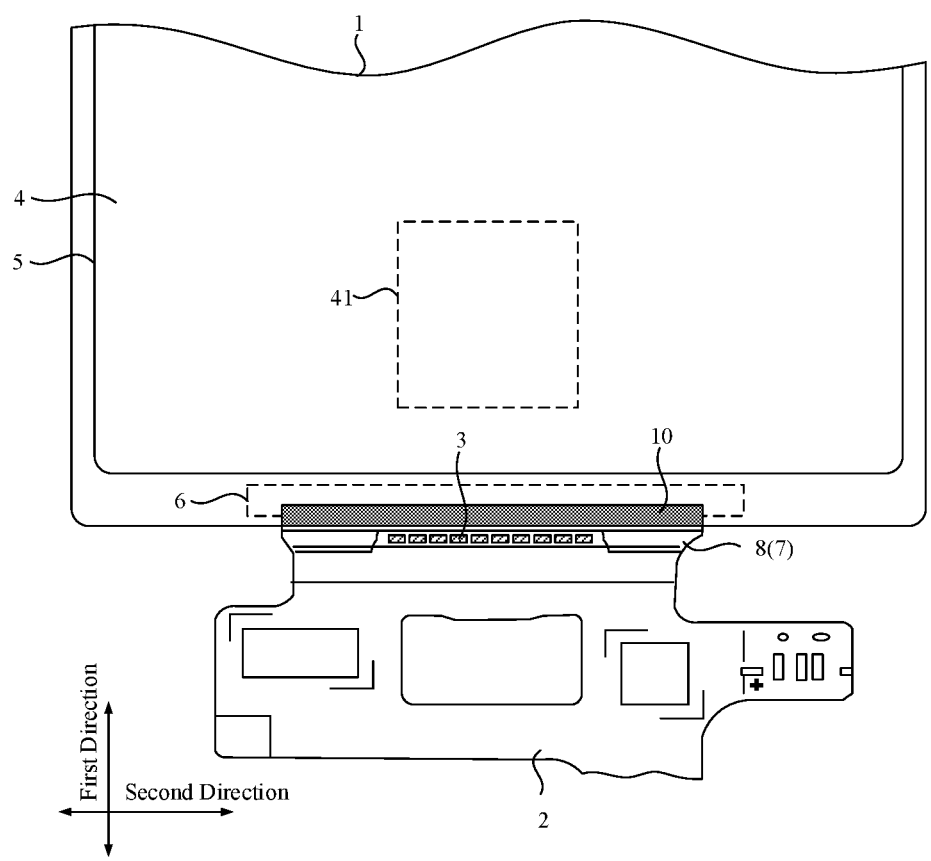
FIG. 11 is a schematic diagram illustrating a light source arrangement according to an embodiment of the present disclosure in a case in which a flexible circuit board is not bent.

FIG. 11 is a schematic diagram illustrating a light source arrangement according to an embodiment of the present disclosure in a case in which a flexible circuit board is not bent. In the embodiment, as shown in FIG. 11, the display area 4 and the step region 6 are arranged along a first direction, a plurality of light sources 3 is arranged along a second direction, and the second direction intersects with the first direction. When the plurality of light sources 3 is arranged along the second direction on the bent sub-portion 8, the light sources 3 are regularly arranged, and an intensity of light transmitted to different parts of the fingerprint recognition region 41 is more uniform. When the finger is pressing the fingerprint recognition region 41, the intensity of light transmitted to different positions of the finger is more uniform. After the light is reflected by the finger, recognition of the fingerprint valley and the fingerprint ridge is more accurate, effectively increasing the detection accuracy of fingerprint recognition.

Figure 12:
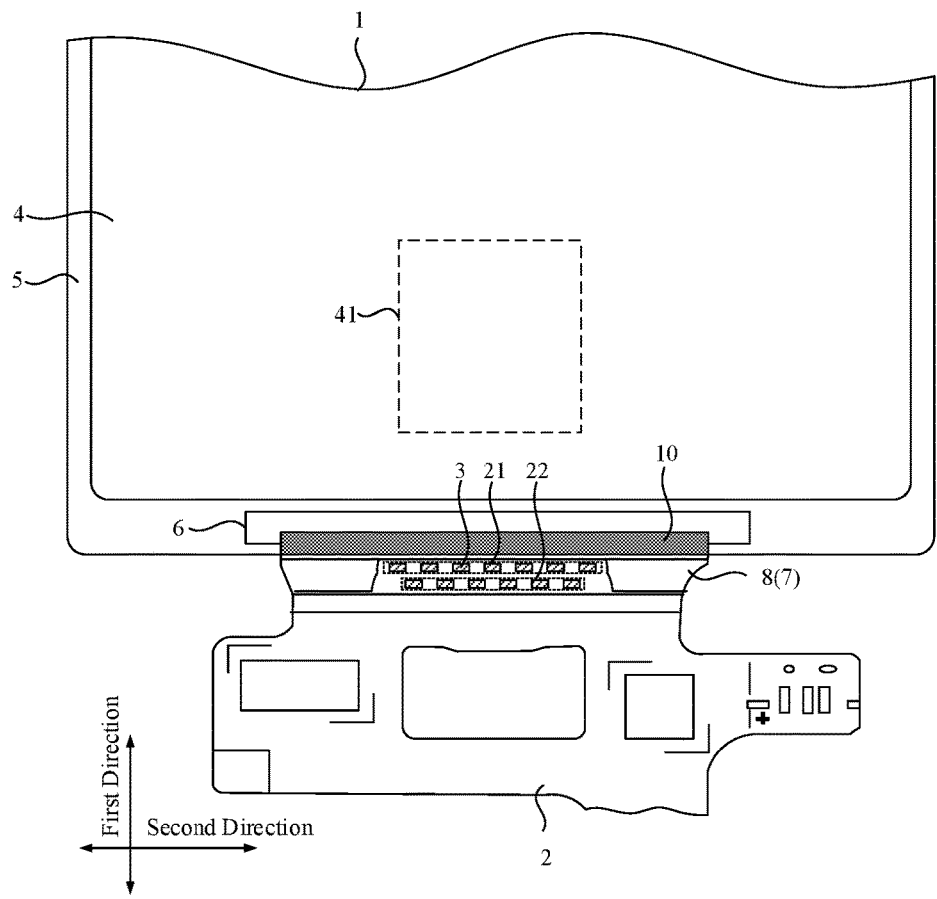
FIG. 12 is a schematic diagram illustrating another light source arrangement according to an embodiment of the present disclosure in a case in which a flexible circuit board is not bent.
Figure 13:
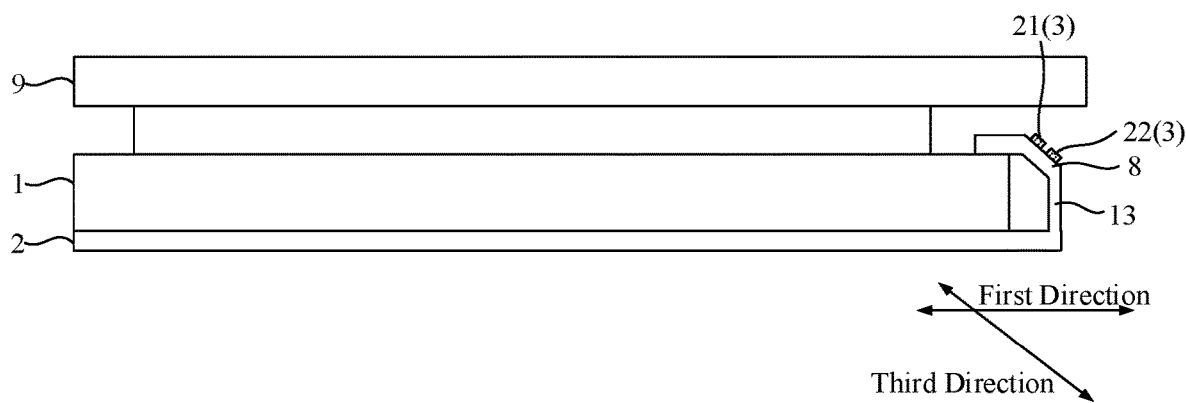
FIG. 13 is a schematic diagram illustrating a light source arrangement corresponding to FIG. 12 in a case in which the flexible circuit board is bent.

FIG. 12 is a schematic diagram illustrating another light source arrangement according to an embodiment of the present disclosure in a case in which a flexible circuit board is not bent, and FIG. 13 is a schematic diagram illustrating a light source arrangement corresponding to FIG. 12 in a case in which the flexible circuit board is bent. In the embodiment, as shown in FIG. 12 and FIG. 13, the display area 4 and the step region 6 are arranged along the first direction, a plurality of light sources 3 includes a first light source set 21 and a second light source set 22 that are arranged along a third direction. Each of the first light source set 21 and the second light source set 22 includes a plurality of light sources 3 arranged along the second direction. The third direction is a direction defined on a basis of the display device having the flexible circuit board bent. The second direction intersects with the first direction, and the third direction intersects with the second direction. In the second direction, the light sources 3 in the first light source set 21 are staggered from the light sources 3 in the second light sources set 22. In this way, the light emitted from the light sources 3 in the second light source set 22 can exit from a gap between two adjacent light sources 3 in the first light source set 21, further increasing uniformity of the intensity of light transmitted to different parts of the fingerprint recognition region 41. When the finger presses the fingerprint recognition region 41, uniformity of the intensity of light transmitted to different positions of the finger can be improved, further improving the detection accuracy of fingerprint recognition.

Figure 14:
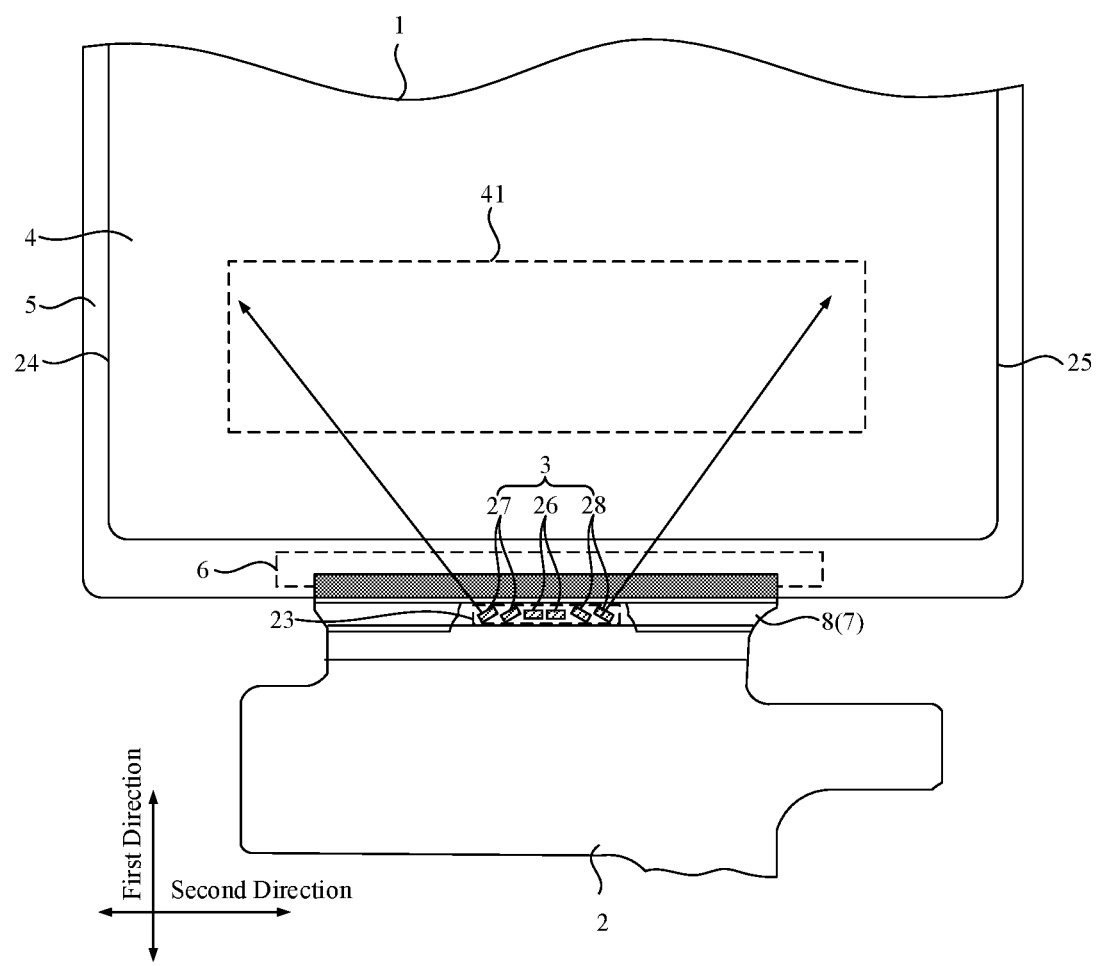
FIG. 14 is a schematic diagram illustrating still another light source arrangement according to an embodiment of the present disclosure in a case in which a flexible circuit board is not bent.

FIG. 14 is a schematic diagram illustrating still another light source arrangement according to an embodiment of the present disclosure in a case in which a flexible circuit board is not bent. In the embodiment, as shown in FIG. 14, the light source 3 is arranged in a middle position 23 of the bent sub-portion 8. Compared to a case in which the light sources 3 are arranged randomly in various positions of the bent sub-portion 8, the light source 3 being arranged in the middle position 23 of the bent sub-portion 8 can improve concentration of light emitted from the light source 3, increasing the intensity of light transmitted to the finger. When the light is reflected by the finger to the sensors in the fingerprint recognition region 41, an intensity difference between the light corresponding to the fingerprint valley and the light corresponding to the fingerprint ridge will be increased, so that the fingerprint valley and the fingerprint ridge can be more accurately recognized, increasing the detection accuracy of fingerprint recognition.

Further, with further reference to FIG. 14, the display area 4 and the step region 6 are arranged along the first direction, and the array substrate 1 includes a first edge 24 and a second edge 25 each extending along the first direction. The light sources 3 include at least one intermediate light source 26, at least one first outer light source 27 and at least one second outer light source 28. The first outer light source 27 is located at a side of the intermediate light source 26 close to the first edge 24, and the second outer light source 28 is located at a side of the intermediate light source 26 close to the second edge 25. A light-exiting surface of the first outer light source 27 is arranged to face towards the first edge 24, and a light-exiting surface of the second outer light source 28 is arranged to face towards the second edge 25. In this way, light emitted from the first outer light source 27 is transmitted towards the first edge 24, and light emitted from the second outer light source 28 is transmitted towards the second edge 25. An overall diffusion area of light emitted from the light sources 3 is relatively large. Correspondingly, restrictions on a location and a dimension of the fingerprint recognition region 41 are relatively small. Based on this structure, the fingerprint recognition region 41 can have a larger area.

Figure 15:
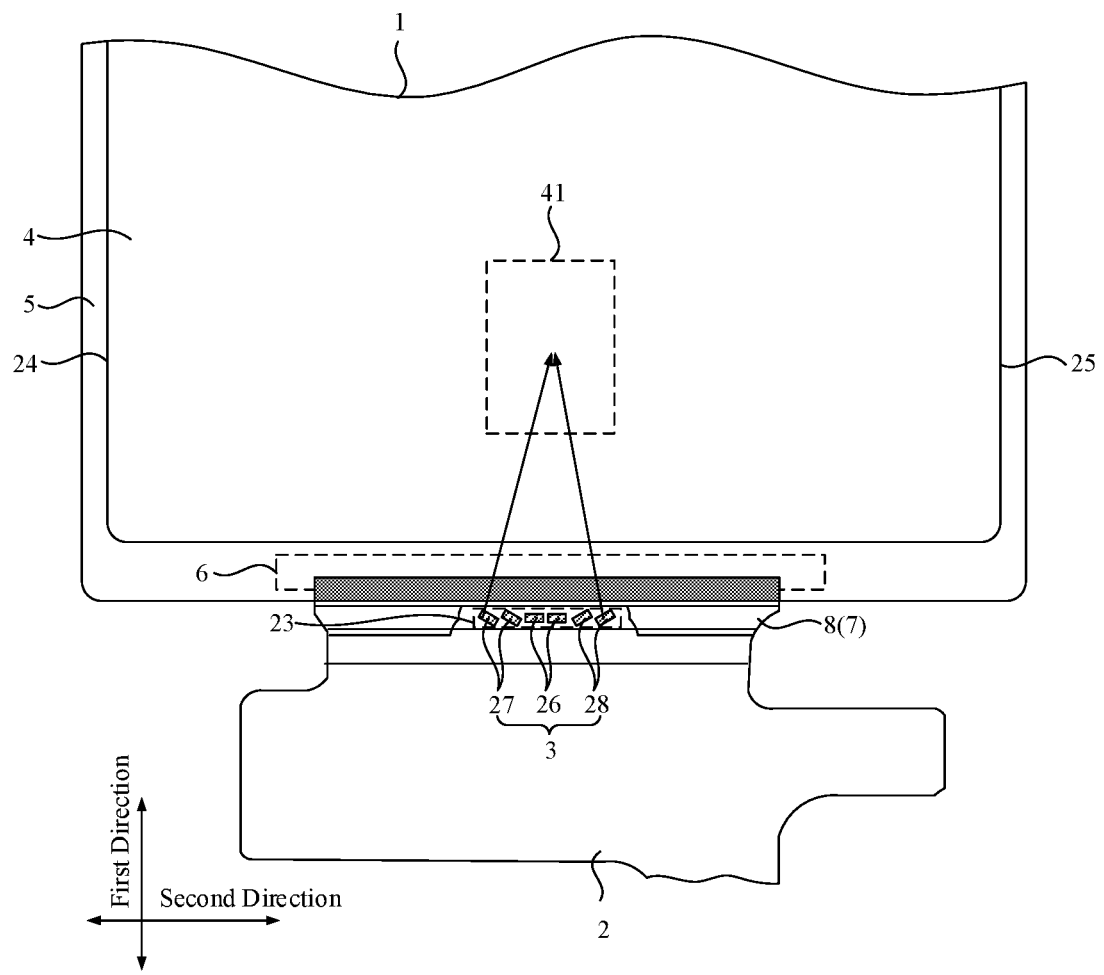
FIG. 15 is a schematic diagram illustrating yet another light source arrangement according to an embodiment of the present disclosure in a case in which a flexible circuit board is not bent.

FIG. 15 is a schematic diagram illustrating yet another light source arrangement according to an embodiment of the present disclosure in a case in which a flexible circuit board is not bent. In another embodiment, as shown in FIG. 15, the display area 4 and the step region 6 are arranged along the first direction, and the array substrate 1 includes a first edge 24 and a second edge 25 each extending along the first direction. The light sources 3 include at least one intermediate light source 26, at least one first outer light source 27 and at least one second outer light source 28. The first outer light source 27 is located at a side of the intermediate light source 26 close to the first edge 24, and the second outer light source 28 is located at a side of the intermediate light source 26 close to the second edge 25. A light-exiting surface 11 of the first outer light source 27 is arranged to face towards the second edge 25, and a light-exiting surface 11 of the second outer light source 28 is arranged to face towards the first edge 24. In this way, light emitted from the first outer light source 27 is transmitted towards the second edge 25, and light emitted from the second outer light source 28 is transmitted towards the first edge 24. An overall diffusion area of light emitted from the light sources 3 is relatively small. Correspondingly, the fingerprint recognition region 41 can have a smaller area. In this case, light transmitted to the fingerprint recognition region 41 has a high concentration. When the finger presses the fingerprint recognition region 41, the intensity of light transmitted to the finger is relatively high. When the light is reflected by the finger to the sensors in the fingerprint recognition region 41, an intensity difference between the light corresponding to the fingerprint valley and the light corresponding to the fingerprint ridge will be increased, so that the fingerprint valley and the fingerprint ridge can be more accurately recognized, increasing the detection accuracy of fingerprint recognition.

It should be noted that a number of intermediate light sources 26, a number of first outer light sources 27, and a number of second outer light sources 28 can be set based on actual requirements. The number of intermediate light sources 26, the number of first outer light sources 27, and the number of second outer light sources 28 may be equal to each other or different from one another.

Figure 16:
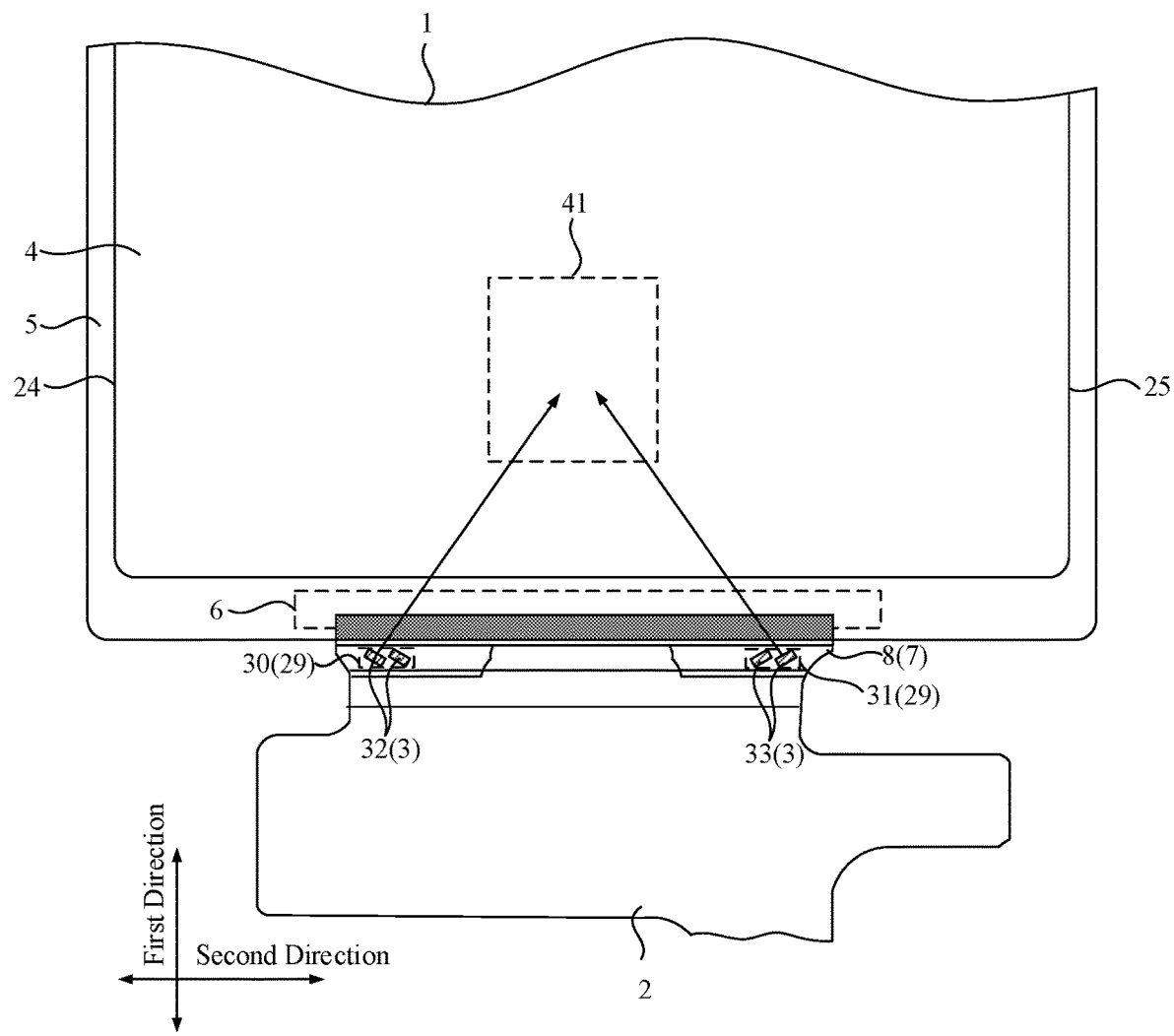
FIG. 16 is a schematic diagram illustrating another light source arrangement according to an embodiment of the present disclosure in a case in which a flexible circuit board is not bent.

FIG. 16 is a schematic diagram illustrating another light source arrangement according to an embodiment of the present disclosure in a case in which a flexible circuit board is not bent. In an embodiment, as shown in FIG. 16, the display area 4 and the step region 6 are arranged along the first direction. The light sources 3 are arranged in two regions 29 on two sides of the bent sub-portion 8 along the second direction. The second direction intersects with the first direction. Compared to a case in which the light sources 3 are arranged randomly in various positions of the bent sub-portion 8, the light sources 3 being arranged in two regions 29 on two sides of the bent sub-portion 8 can prevent light emitted from the light sources 3 from being extremely divergent. Moreover, concentration of light emitted from the light source 3 can be increased, increasing the intensity of light transmitted to the finger.

Further, with further reference to FIG. 16, the display area 4 and the step region 6 are arranged along the first direction. The array substrate 1 includes a first edge 24 and a second edge 25 each extending along the first direction. The bent sub-portion 8 includes a first side 30 and a second side 31. The first side 30 is close to the first edge 24, and the second side 31 is close to the second edge 25. The light sources 3 include at least one first light source 32 and at least one second light source 33. The first light source 32 is located at the first side 30, and a light-exiting surface 11 of the first light source 32 is arranged to face towards the second edge 25. The second light source 33 is located at the second side 31, and a light-exiting surface 11 of the second light source 33 is arranged to face towards the first edge 24. In this way, light emitted from the first light source 32 located at the first side 30 is transmitted towards the second edge 25, and light emitted from the second light source 33 located at the second side 31 is transmitted towards the first edge 24. An overall diffusion area of light emitted from the light sources 3 is relatively small. Correspondingly, the fingerprint recognition region 41 can have a smaller area.

It should be noted that the position of the light source 3 and an orientation of the light-exiting surface of the light source 3 can be set according to actual requirements. In one embodiment, if the fingerprint recognition region 41 of the display panel is required to have a large area, the arrangement manner as shown FIG. 14 can be adopted. If the fingerprint recognition region 41 of the display panel is required to have a small area, the arrangement manner as shown FIG. 15 or FIG. 16 can be adopted.

In an embodiment, the light source 3 is a light-emitting diode. The light source 3 is provided on the bent sub-portion 8 by a surface-mounting technology, to achieve an electrical connection with the flexible circuit board 2, achieving light emission under power provided by the flexible circuit board.

In addition, it should also be noted that in this embodiment of the present disclosure, the dimension of the light source 3 may be set based on actual requirements, as long as the light source 3 is located in a gap formed between the bent sub-portion 8 and the glass cover 9. In an example, the dimension of the light source 3 may be 1*0.5*0.3 mm. Moreover, there is no limitation on a bracket for fixing the light source 3 in this embodiment of the present disclosure, as long as the fixed light source 3 adopts the side setting manner to emit light.

Figure 17:
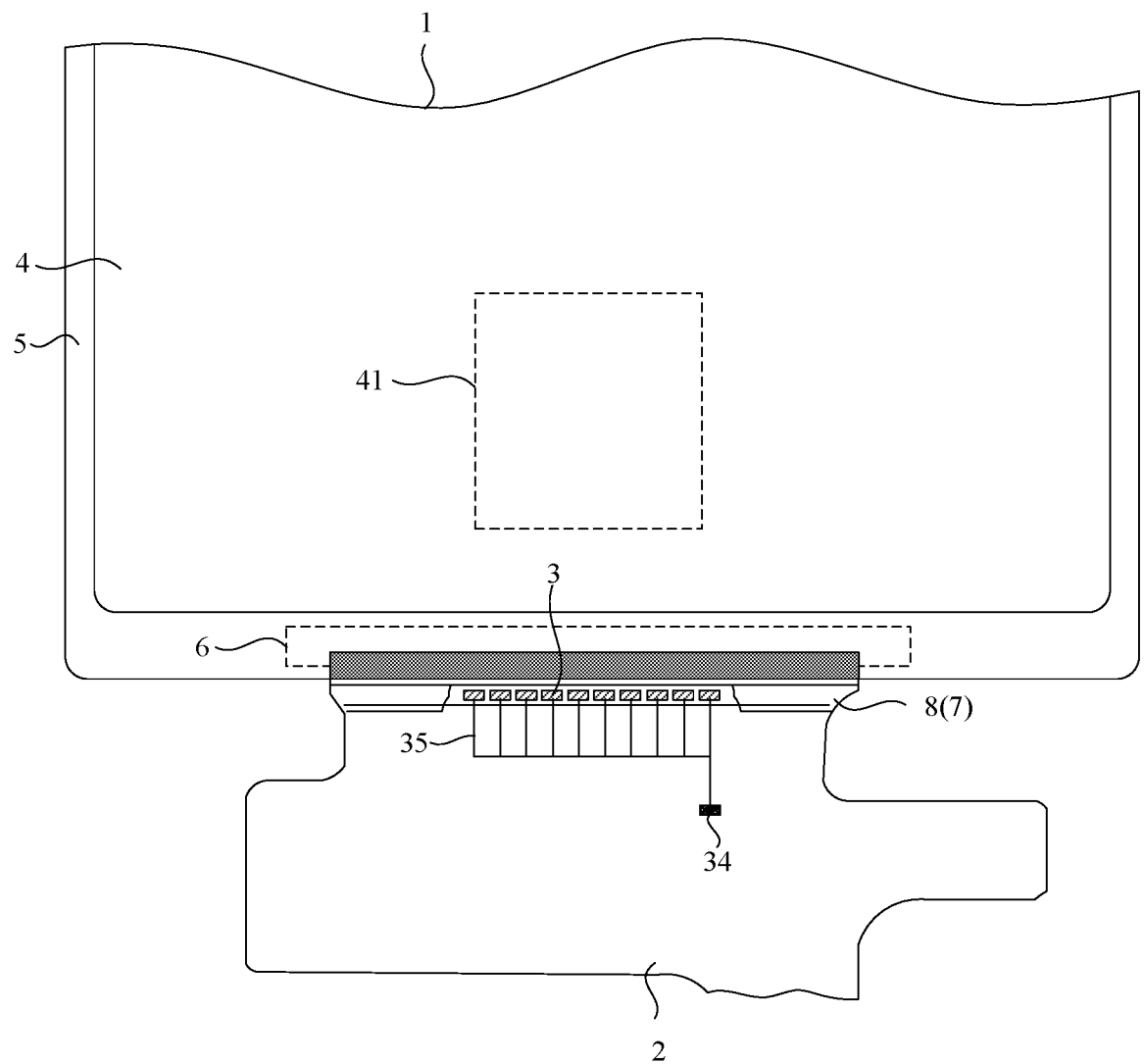
FIG. 17 is a schematic diagram of a structure of another flexible circuit board which is not bent according to an embodiment of the present disclosure.

FIG. 17 is a schematic diagram of a structure of another flexible circuit board which is not bent according to an embodiment of the present disclosure. In the embodiment, as shown in FIG. 17, the display device further includes a mainboard, which is provided with a power signal terminal. The flexible circuit board 2 is provided with a connection pin 34 and a connection wire 35, and the light source 3 is electrically connected to the connection pin 34 through the connection wire 35. The connection pin 34 is electrically connected to the power signal terminal of the mainboard, to achieve a signal communication between the light source 3 and the power signal terminal. When it is needed to perform fingerprint recognition, the power signal terminal provides a power signal, so that the light source 3 emits light under an action of the power signal, providing the required detection light for the fingerprint recognition function. In an example, each light source 3 may be electrically connected to one connection pin 34 through one connection wire 35, or all light sources 3 may be connected to a single one connection pin 34 through the connection wire 35, or some light sources 3 may be connected to a single one connection pin 34 through the connection wire 35.

What is claimed is:

1. A display device, comprising:
an array substrate having a display area and a non-display area at least partially surrounding the display area, wherein the non-display area comprises a step region, and a part of the display area is reused as a fingerprint recognition region;
a flexible circuit board, wherein the flexible circuit board is bonded to the step region and is bent to a side of the array substrate facing away from a light-exiting direction of the display device; the flexible circuit board comprises a bent portion facing towards a side surface of the array substrate; and the bent portion comprises a bent sub-portion, which is tilted towards the display area along the light-exiting direction of the display device; and
at least one light source arranged on the bent sub-portion of the flexible circuit board, wherein light emitted from the at least one light source is transmitted towards the fingerprint recognition region,
wherein the flexible circuit board further comprises a bonding portion, the flexible circuit board is bonded to the step region through the bonding portion, and the bonding portion is connected to the bent sub-portion; and
an angle A is formed between the bent sub-portion and the bonding portion, where A>0°; and a projection of the at least one light source on the array substrate is within a projection of the bent sub-portion on the array substrate.

2. The display device according to claim 1, wherein 145°≤A≤175°, and a distance between a center point of the fingerprint recognition region and a light-exiting surface of the at least one light source is L, where 0<L≤20 mm.

3. The display device according to claim 1, wherein the flexible circuit board further comprises:
a function portion bent to the side of the array substrate facing away from the light-exiting direction of the display device, and
a transition sub-portion located between the bent sub-portion and the function portion, wherein an angle B is formed between the transition sub-portion and the bent sub-portion, where B<180°.

4. The display device according to claim 1, wherein the flexible circuit board has a first region and a second region, and the at least one light source is arranged in the first region, and
wherein the flexible circuit board has a larger thickness in the first region than in the second region.

5. The display device according to claim 4, wherein the flexible circuit board further comprises a first metal foil, a base, and a second metal foil, and
wherein an orthographic projection of the first metal foil onto the base overlaps the first region and the second region, and an orthographic projection of the second metal foil onto the base overlaps the first region.

6. The display device according to claim 1, wherein the flexible circuit board further comprises a bonding portion, the flexible circuit board is bonded to the step region through the bonding portion, and the bonding portion is connected to the bent sub-portion, and
wherein the display device further comprises a stabilization layer located at a side of the bonding portion facing away from the light-exiting direction of the display device and at a side of the bent sub-portion facing away from the light-exiting direction of the display device, and the stabilization layer overlaps at least a junction between the bonding portion and the bent sub-portion.

7. The display device according to claim 6, wherein an orthographic projection of the stabilization layer onto the bent sub-portion overlaps an orthographic projection of the at least one light source onto the bent sub-portion.

8. The display device according to claim 6, wherein the stabilization layer is an adhesive layer.

9. The display device according to claim 6, wherein the stabilization layer is a reinforcing plate.

10. The display device according to claim 1, wherein the flexible circuit board further comprises a bonding portion, the flexible circuit board is bonded to the step region through the bonding portion, and the bonding portion is connected to the bent sub-portion by an arc-shaped connection portion.

11. The display device according to claim 1, wherein the display area and the step region are arranged along a first direction, and
wherein the at least one light source comprises a plurality of light sources arranged along a second direction, and the second direction intersects with the first direction.

12. The display device according to claim 1, wherein the display area and the step region are arranged along a first direction; the at least one light source comprises a first light source set and a second light source set arranged along a third direction, and each of the first light source set and the second light source set comprises a plurality of light sources arranged along a second direction, wherein the second direction intersects with the first direction, and the third direction intersects with the second direction, and
wherein along the second direction, the plurality of light sources in the first light source set is staggered from the plurality of light sources in the second light source set.

13. The display device according to claim 1, wherein the at least one light source is arranged in a middle region of the bent sub-portion.

14. The display device according to claim 13, wherein the display area and the step region are arranged along a first direction, and the array substrate comprises a first edge and a second edge each extending along the first direction;
the at least one light source comprises at least one intermediate light source, at least one first outer light source, and at least one second outer light source; the at least one first outer light source is located at a side of the at least one intermediate light source close to the first edge, and the at least one second outer light source is located at a side of the at least one intermediate light source close to the second edge; and
a light-exiting surface of each of the at least one first outer light source is arranged to face towards the first edge, and a light-exiting surface of each of the at least one second outer light source is arranged to face towards the second edge.

15. The display device according to claim 13, wherein the display area and the step region are arranged along a first direction, and the array substrate comprises a first edge and a second edge each extending along the first direction,
wherein the at least one light source comprises at least one intermediate light source, at least one first outer light source, and at least one second outer light source; the at least one first outer light source is located at a side of the at least one intermediate light source close to the first edge, and the at least one second outer light source is located at a side of the at least one intermediate light source close to the second edge, and
wherein a light-exiting surface of each of the at least one first outer light source is arranged to face towards the second edge, and a light-exiting surface of each of the at least one second outer light source is arranged to face towards the first edge.

16. The display device according to claim 1, wherein the display area and the step region are arranged along a first direction, and
wherein the at least one light source is arranged in two regions on two sides of the bent sub-portion in a second direction, and the second direction intersects with the first direction.

17. The display device according to claim 16, wherein the array substrate comprises a first edge and a second edge each extending along the first direction;
the bent sub-portion comprises a first side and a second side, the first side is close to the first edge, and the second side is close to the second edge;
the at least one light source comprises at least one first light source and at least one second light source; the at least one first light source is located at the first side, and a light-exiting surface of each of the at least one first light source is arranged to face towards the second edge; the at least one second light source is located at the second side, and a light-exiting surface of each of the at least one second light source is arranged to face towards the first edge.

18. The display device according to claim 1, wherein each of the at least one light source is a light-emitting diode, and the at least one light source is provided on the bent sub-portion by a surface-mounting technology.

19. The display device according to claim 1, further comprising a mainboard provided with a power signal terminal,
wherein the flexible circuit board is provided with a connection pin and a connection wire, the at least one light source is electrically connected to the connection pin through the connection wire, and the connection pin is electrically connected to the power signal terminal.

* * * * *